(12) United States Patent
Heimann et al.

(10) Patent No.: US 9,954,525 B2
(45) Date of Patent: Apr. 24, 2018

(54) TOUCH- AND/OR PROXIMITY-SENSITIVE INPUT DEVICE, AND HOUSEHOLD APPLIANCE HAVING THE INPUT DEVICE

(71) Applicant: DIEHL AKO STIFTUNG & CO. KG, Wangen (DE)

(72) Inventors: Uwe Heimann, Wangen (DE); Michael Prinz, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 53 days.

(21) Appl. No.: 15/011,904

(22) Filed: Feb. 1, 2016

(65) Prior Publication Data

US 2016/0149571 A1 May 26, 2016

Related U.S. Application Data

(63) Continuation of application No. PCT/EP2014/001870, filed on Jul. 8, 2014.

(30) Foreign Application Priority Data

Aug. 1, 2013 (DE) .................. 10 2013 012 886
Dec. 21, 2013 (DE) .................. 10 2013 022 100

(51) Int. Cl.
*H03K 17/975* (2006.01)
*H03K 17/955* (2006.01)
(Continued)

(52) U.S. Cl.
CPC .......... *H03K 17/955* (2013.01); *G06F 3/044* (2013.01); *H03K 17/962* (2013.01);
(Continued)

(58) Field of Classification Search
CPC .... G06F 3/044; H03K 17/962; H03K 17/975; H03K 2217/960755; H03K 17/9622
(Continued)

(56) References Cited

U.S. PATENT DOCUMENTS

| 5,584,563 | A | * | 12/1996 | Stottmann | ........... A47L 15/4293 |
| | | | | | 116/DIG. 28 |
| 7,507,929 | B2 | | 3/2009 | Streifler | |
| 2010/0118560 | A1 | | 5/2010 | Hayama et al. | |

FOREIGN PATENT DOCUMENTS

| DE | 202007006266 U1 | 9/2007 |
| EP | 1629330 B1 | 3/2010 |

(Continued)

*Primary Examiner* — Ahmed Saeed
(74) *Attorney, Agent, or Firm* — Laurence A. Greenberg; Werner H. Stemer; Ralph F. Locher

(57) ABSTRACT

A touch- and/or proximity-sensitive input device has a cover plate with a control section. The side of the control section facing a user forms a control field for the user and a side facing away from the user forms a sensor plane. A sensor film has at least one capacitive sensor field within the control section of the cover plate. A carrier plate has at least one electric contact field. The cover plate has a contacting section next to the control section and the side facing away from the user forms a contacting plane. The sensor film has an electric contact field next to the sensor field. At least one electric contact element connects the electric contact field of the sensor film electrically conductively to the at least one electric contact field of the carrier plate.

14 Claims, 6 Drawing Sheets

(51) Int. Cl.
  *H03K 17/96* (2006.01)
  *G06F 3/044* (2006.01)
  *H03K 17/945* (2006.01)

(52) U.S. Cl.
  CPC ... *H03K 17/975* (2013.01); *H03K 2017/9455* (2013.01); *H03K 2217/96076* (2013.01)

(58) Field of Classification Search
  USPC ................................. 200/600; 345/173, 174
  See application file for complete search history.

(56) References Cited

FOREIGN PATENT DOCUMENTS

| | | | |
|---|---|---|---|
| EP | 2045923 | B1 | 9/2010 |
| GB | 2437983 | A | 11/2007 |
| WO | 2011160960 | A1 | 12/2011 |
| WO | 2015014436 | A1 | 2/2015 |

\* cited by examiner

TOUCH- AND/OR PROXIMITY-SENSITIVE INPUT DEVICE, AND HOUSEHOLD APPLIANCE HAVING THE INPUT DEVICE

CROSS-REFERENCE TO RELATED APPLICATION

This application is a continuation, under 35 U.S.C. § 120, of copending international patent application No. PCT/EP2014/001870, filed Jul. 8, 2014, which designated the United States; this application also claims the priority, under 35 U.S.C. § 119, of German patent applications Nos. DE 10 2013 012 886.2, filed Aug. 1, 2013 and DE 10 2013 022 100.5 filed Dec. 21, 2013; the prior applications are herewith incorporated by reference in their entirety.

BACKGROUND OF THE INVENTION

Field of the Invention

The present invention relates to a touch- and/or proximity-sensitive input device, in particular with a capacitive working principle and in particular for an electronic household appliance. The invention further relates to an electronic household appliance with such an input device.

In many electric or electronic appliances, in particular also in household appliances such as ovens, stovetops, microwave ovens, dishwashers, washing machines, washer driers, refrigerators and the like, touch- and/or proximity-sensitive buttons or touch or proximity switches are often used which, for example, initiate a specific switching process and/or change an appliance setting simply by a user touching or moving his/her finger close to them ("touch control").

In the case of a capacitive switch, a capacitive sensor element made from an electrically conductive material forms, together with a finger of the user for example, via a dielectric (often in the form of a cover plate made from an electrically insulating material) a capacitance which can vary according to the activation of the switch, i.e. touching or not touching, or moving a finger close or not to a control field associated with the capacitive sensor element. The change in the value of the capacitance of the capacitive sensor element has a corresponding effect on an output signal of the sensor circuit which can be processed and evaluated by an electronic evaluation unit in order to interpret an activation of the capacitive switch as necessary.

Such capacitive touch- and/or proximity-sensitive input devices can, for example, have a bendable or flexible flat material in the form of a conductively coated carrier film as a sensor element, which material is, on the one hand, arranged behind an electrically insulating cover plate and, on the other hand, held mechanically and contacted electrically in a contact terminal on a circuit board, as is disclosed, for example, in U.S. Pat. No. 7,507,929 B2 and its corresponding European patent EP 1 629 330 B1. In European patent No. EP 2 045 923 B1, the electrical connection between the sensor element and the circuit board is made by a Z-shaped contact spring and, in the case of international patent application WO 2011/160960 A1, it is made by a C-shaped contact spring, wherein the contact springs are each positioned in both cases directly behind the control field.

SUMMARY OF THE INVENTION

It is accordingly an object of the invention to provide a touch- and/or proximity-sensitive input device which overcomes the various disadvantages of the heretofore-known devices and methods of this general type and which is able to ensure a good signal output and a good electrical connection to the electronic evaluation unit, in particular also in the event of different designs of control panels.

With the foregoing and other objects in view there is provided, in accordance with the invention, a touch- and/or proximity-sensitive input device, in particular for an electronic household appliance. The input device comprises:

a cover plate having a control section, the control section having a side facing a user of the input device and forming a control field for the user, and having a side facing away from the user and forming a sensor plane;

a sensor film disposed on the side of the cover plate facing away from the user, the sensor film having at least one capacitive sensor field within the region of the control section;

a carrier plate disposed on a side of the sensor film facing away from the user, and at least one electric contact field on the carrier plate;

the cover plate having a contacting section disposed, in a direction of the sensor plane, next to the control section, the contacting section having a side facing away from the user and forming a contacting plane;

the sensor film having at least one electric contact field disposed, in a direction of the sensor plane, next to the at least one sensor field and connected electrically conductively to the at least one sensor field; and at least one electric contact element disposed between the carrier plate and the sensor film for connecting the at least one sensor field of the sensor film electrically conductively to the at least one electric contact field on the carrier plate, the at least one electric contact element connecting the at least one electric contact field of the sensor film electrically conductively to the at least one electric contact field on the carrier plate.

In other words, the novel touch- and/or proximity-sensitive input device of the invention has: a cover plate with a control section, wherein a side of the control section facing a user of the input device forms a control field for the user, and a side of the control section facing away from the user forms a sensor plane; a sensor film which is arranged on a side of the cover plate which faces away from the user, and has at least one capacitive sensor field in the region of the control section; a carrier plate which is arranged on a side of the sensor film which faces away from the user and on which at least one electric contact field is provided; and at least one electric contact element which is arranged between the carrier plate and the sensor film in order to connect the at least one sensor field of the sensor film electrically conductively to the at least one electric contact field of the carrier plate. The cover plate additionally has a contacting section which is arranged in one direction of the sensor plane next to the control section and that side of which that faces away from the user forms a contacting plane. The sensor film additionally has at least one electric contact field which is arranged in one direction of the sensor plane next to the at least one sensor field and is connected electrically conductively to the at least one sensor field. And the at least one electric contact element connects the at least one electric contact field of the sensor film electrically conductively to the at least one electric contact field of the carrier plate.

A control panel, for example of an electronic household appliance, can have an essentially flat design or have a three-dimensional structure (for example, curved, domed, etc). In order to obtain an optimum signal output, the capacitive sensor fields should match the form of the control panel, i.e. have as uniform spacing as possible from their outer sides facing the user. On the other hand, the capacitive sensor fields must be connected electrically conductively to the electric contact fields of a carrier plate in order to be connected to an electronic evaluation unit. In the input device according to the invention, on the one hand the sensor film has separate capacitive sensor fields and electric contact fields, and on the other hand the cover plate has a control section and a contacting section next to the control section. As a result of this measure, the functionalities of the capacitive sensor unit and the electric contacting are spatially separated. As a result, they can be adapted optimally independently of each other. Whatever the design of the control panel, a reliable sensor unit and a simple and secure electrical contacting can thus be ensured. Preferably, simply designed components, in particular standard components such as, for example, simple stamped/bent parts can thus be used for the electric contact elements. The spatial arrangement of the sensor unit and the contacting, which is more or less complex depending on the three-dimensional design of the control panel, can advantageously be transferred into the cover plate and the sensor film can be simply adapted to the structure of the latter. The cover plate can preferably be manufactured as a simple injection-molded part. The input device of the invention can, taken as a whole, be composed of simple components but nevertheless be adapted to complex three-dimensional structures.

The electric contacting is achieved by a rigid cover plate as a carrier for the sensor film and the preferably elastic contact elements. Advantages in terms of quality of assembly, reproducibility and automatability can consequently be achieved. Moreover, it is possible for there to no longer be any need for specific connector elements on the carrier plate in order to connect, for example, flexible cable outlets, or for the sensor film itself.

In this connection, the carrier plate is preferably a circuit board or a plastic plate. The carrier plate is preferably designed as a stable plate body, but can also be flexible and/or just have the thickness of a film. In a preferred embodiment of the invention, an electronic evaluation unit is also arranged on the carrier plate and is connected electrically conductively to the at least one electric contact element. In connection with the present invention, the electronic evaluation unit serves in particular to process and evaluate the output signals detected at the at least one capacitive sensor field of the sensor film in order to establish actuation of the switch (by a user touching or moving his/her finger close to the control field of the control section of the cover plate). This electronic evaluation unit must be distinguished from the management unit of, for example, the household appliance into which the input device of the invention can be installed, to which the electronic evaluation unit is connected, and which can be arranged, together with the electronic evaluation unit, on the carrier plate or at another location in the household appliance. In some applications, the electronic evaluation unit can also preferably be integrated into this management unit.

In this connection, it is intended that the side of a component facing the user or facing away from the user refers to that side which faces the user (i.e. faces outwards) or faces away from him/her (i.e. faces inwards) in the installed state of the input device (for example, in an electronic household appliance).

Depending on the number of sensor films and sensor fields, in this connection the input device can have one or more touch- and/or proximity-sensitive switches with a capacitive measurement principle.

The sensor film is preferably based on a carrier film made from a plastic material. The carrier film is preferably manufactured from PET, PC or the like. The carrier film can have a single- or multi-layer construction. The sensor fields and the electric contact fields are preferably imprinted or coated onto the carrier film (for example with an electrically conductive paint, paste, or ink). The imprinting or coating is preferably performed in one or more layers. The sensor fields and the contact fields are connected to one another electrically conductively, preferably by means of electric connecting lines which are preferably printed or coated onto the carrier film. The sensor film preferably has a layer thickness of at most 0.5 mm, preferably at most 0.3 mm or less. The sensor film preferably takes the form of a flexible component. The sensor film can thus preferably match the structure of the cover plate. Sensor fields and contact fields are preferably arranged on that side of the carrier film facing away from the cover plate but can optionally also be provided on the side facing the cover plate.

The cover plate or at least its control section are preferably manufactured from an electrically insulating material so that it acts as a dielectric between the sensor fields and the user. Alternatively, an electrically insulating element is additionally provided on that side of the cover plate facing the user. The cover plate is preferably manufactured from a plastic material (for example PC, PMMA), glass, glass ceramic or the like. The cover plate can, depending on its material, also be referred to as a glass cover. The cover plate is preferably manufactured as an injection-molded part. The cover plate is preferably a rigid, i.e. dimensionally stable component. The contacting section is preferably rigidly connected to the control section of the cover plate. The cover plate is preferably a single-piece component. The cover plate can preferably be inserted into a control panel of, for example, an electronic household appliance, wherein the design in particular of the control section of the cover plate matches the construction of the control panel (i.e. for example also has an essentially flat or bent/curved design).

That side of the control section of the cover plate which faces away from the user is referred to as the sensor plane. In this connection, the sensor plane does not necessarily refer exactly to the plane within which the capacitive sensor fields of the sensor film lie but defines a base plane for them. The sensor fields of the sensor film are preferably arranged parallel to the sensor plane. In this connection, the sensor plane is not necessarily a geometric spatial plane but a surface which preferably extends parallel to that outer side of the cover plate or the control panel which faces the user. In this way, the capacitive sensor fields of the sensor film preferably also extend parallel to that outer side of the cover plate or the control panel which faces the user. This preferably also applies in the case of control fields or control panels with a three-dimensional structure (i.e. bent, curved, domed, etc).

That side of the contacting section of the cover plate which faces away from the user is referred to as the contacting plane. In this connection, the contacting plane does not necessarily refer exactly to the plane within which the electric contact fields of the sensor film lie but defines a base plane for them. The contact fields of the sensor film are preferably arranged parallel to the contacting plane. In this connection, the contacting plane is not necessarily a geometric spatial plane but a surface which preferably extends preferably parallel to the carrier plate. In this way, the electric contact fields of the sensor film preferably also extend parallel to the carrier plate so that an electrically conductive connection between the sensor unit and the electronic evaluation unit can be created here using simple electric contact elements. This electric contacting can here be reliably achieved independently of the respective three-dimensional structure (i.e. bent, curved, domed, etc) or flat design of the control field or the control panel. By virtue of the parallel nature of the contacting plane and the carrier plate, the same or similar contact elements can preferably be used which, in the assembled state of the input device, can be charged (substantially) equally and can be fitted very economically.

In the input device of the invention, the orientation of the contacting plane of the contacting section of the cover plate is fundamentally independent of the orientation of the sensor plane of the control section of the cover plate. Depending on the design of the control panel, the contacting plane extends in particular not necessarily parallel to the sensor plane. Instead, the sensor plane of the control section is matched to the control panel of, for example, the electronic household appliance, whilst the contacting plane of the contacting section is matched to the carrier plate of the input device.

In this connection, the electric contact element refers to a structural element which is suitable for producing an electrically conductive connection between two components or contact fields. The contact element is preferably formed from an electrically conductive material (preferably metal) and/or is coated electrically conductively. The at least one electric contact element is preferably elastically configured and/or arranged in a direction transverse to the contacting plane. The at least one electric contact element preferably takes the form of a spring element, preferably a leaf spring element. The at least one electric contact element preferably takes the form of a Z-, S-, C or spiral-shaped spring element.

In accordance with an added feature of the invention, the cover plate has a connecting section which connects the contacting section essentially rigidly to the control section. The connecting section can be designed to be essentially flat, in particular if the sensor plane and the contacting plane are oriented essentially in the same plane. The connecting section preferably compensates for differences in the spatial orientation of the control section and the contacting section of the cover plate and/or in their spacing from the carrier plate.

In a preferred embodiment of the invention, this connecting section of the cover plate has a curved design such that the sensor plane formed by the control section of the cover plate and the contacting plane formed by the contacting section of the cover plate extend at least partially at different distances from and/or orientations with respect to the carrier plate. In another preferred embodiment of the invention, this connecting section has an essentially flat design.

In a further preferred embodiment of the invention, the sensor film is firmly connected to that side of the cover plate facing away from the user. This firm connection is preferably designed to be permanent or detachable. The sensor film is connected to the cover plate preferably by means of adhesive bonding, lamination, or injection (preferably IML, in-mold labeling). In this embodiment, the cover plate forms a (dimensionally stable) carrier for the sensor film.

In another further preferred embodiment of the invention, the at least one electric contact element is firmly connected to the at least one electric contact field of the sensor film or to the at least one electric contact field of the carrier plate. In a preferred alternative embodiment, the electric contact element is welded to the contact field of the carrier plate. In another preferred alternative embodiment, the electric contact element is integrally attached to the sensor film or to its contact field, for example by being heat staked, injection molded, clipped on, pushed on, pressed in or the like.

In a preferred embodiment of the invention, the at least one electric contact element has, on its side facing the at least one electric contact field of the sensor film, a contact section which is designed in order to penetrate at least partially into the at least one electric contact field of the sensor film. When sprayed on the surface, conductive plastics often form layers which are non-conductive, or poorly conductive. The conductive particles introduced into the plastic have a homogeneous distribution in granular form but separate on the surface owing to the process parameters and process conditions. In particular in the case of elastic contact elements when there is little spring force, this can be a problem for the electrically conductive connection. With the special design of the contact element, the electrically conductive contact element penetrates at least partially into the contact field of the sensor film and thus ensures an electrically conductive connection with the electrically conductive layers of the contact field. This can preferably be achieved by scratching or incising the surface of the contact field of the sensor film in order to perforate the poorly conductive layers of the contact field. In preferred embodiments of the contact element, this can be achieved by adapting the position of the stamping burr or forming a cutting or scratching edge on the contact section of the electric contact element. Alternatively or additionally, the contact field of the sensor film can also be roughened, for example by an erosion structure of the contact field or by mechanical roughening.

In a further preferred embodiment of the invention, at least one display device is arranged on the carrier plate and the cover plate and the sensor film are designed to be at least partially transparent. As a result of these measures, the control field of the input device can be backlit and/or the positions of the capacitive sensor field in the control section of the cover plate can be identified/illuminated visually. Moreover, in this embodiment the control field of the input device can be used simultaneously as a display field (for example for current values of the set operating parameters, current operating states, etc). In this connection, the display device is preferably a simple LED or group of LEDs, an LED display, a TFT monitor, an LCD display, or the like.

The subject of the invention is also an electronic household appliance with at least one above described touch- and/or proximity-sensitive input device of the invention. The (large) household appliance is preferably a laundry appliance (for example a washing machine, washer drier, etc), a dishwasher, a stovetop, an oven, a refrigerating and/or freezing appliance, or the like.

In a preferred embodiment of the invention, the control section of the cover plate of the input device according to the invention is arranged behind an at least partially transparent control panel or in a recess of a control panel.

The terms "essentially" and "substantially," as used herein, should be understood to allow for a certain amount of tolerance within the functional limits. That is, substantially parallel and essentially parallel connote a parallel disposition that might slightly deviate from a perfectly parallel arrangement but still retain all functions and appearances of a perfectly parallel arrangement.

Other features which are considered as characteristic for the invention are set forth in the appended claims.

Although the invention is illustrated and described herein as embodied in a touch- and/or proximity-sensitive input device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
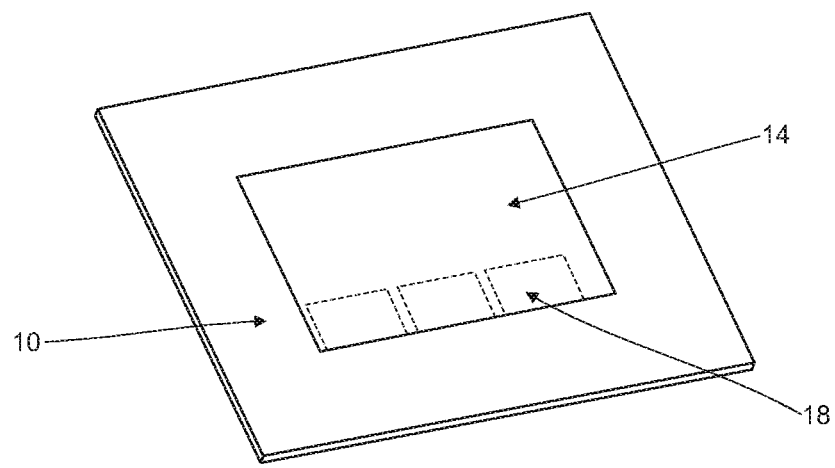
FIG. 1 shows a top perspective view of an input device according to the invention.

Referring now to the figures of the drawing in detail and first, particularly, to FIGS. 1 to 4, there is shown a first exemplary embodiment of a touch- and/or proximity-sensitive input device, as can be used for example in a (large) household appliance such as, for example, a washing machine or a dishwasher.

The input device is installed in the household appliance behind a control panel 10, which is made, for example, from plastic or glass ceramic. A recess 12, or cutout 12, which is rectangular in this case, is provided in the control panel 10. The control panel 10 can also have a transparent region instead of the recess 12. In this exemplary embodiment, the control panel 10 is designed to be flat in essence, at least in the region of the input device. That (outer) side of the control panel 10 or the input device which faces the user points upwards in each case in FIGS. 1 to 4.

A cover plate 14, made for example from a transparent, electrically insulating plastic, glass, or glass ceramic material, is arranged on that side of the control panel 10 which faces away from the user. This cover plate 14 has an essentially flat control section 14a. This control section 14a is designed to be thicker than the remainder of the cover plate 14 and is shaped and dimensioned according to the recess 12 in the control panel 10 so that it projects into the recess 12 and finishes essentially flush with the outer side of the control panel 10 (see, FIGS. 3 and 4).

Figure 2:
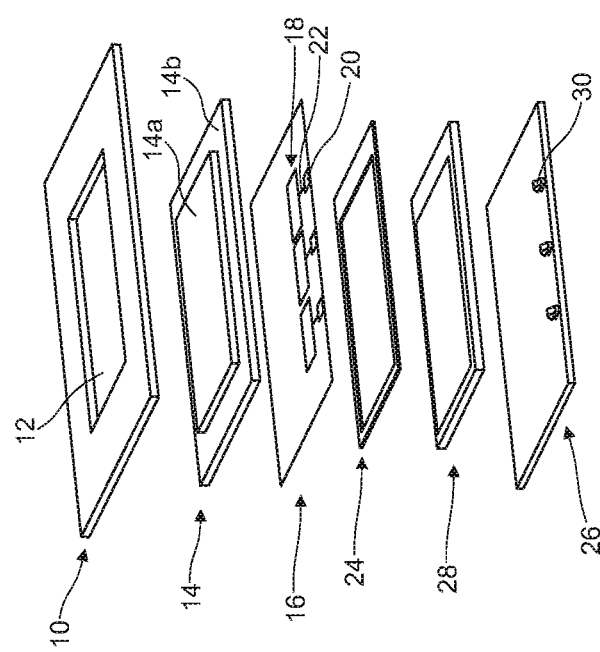
FIG. 2 shows a perspective exploded view of an input device according to a first exemplary embodiment of the invention.
Figure 3:
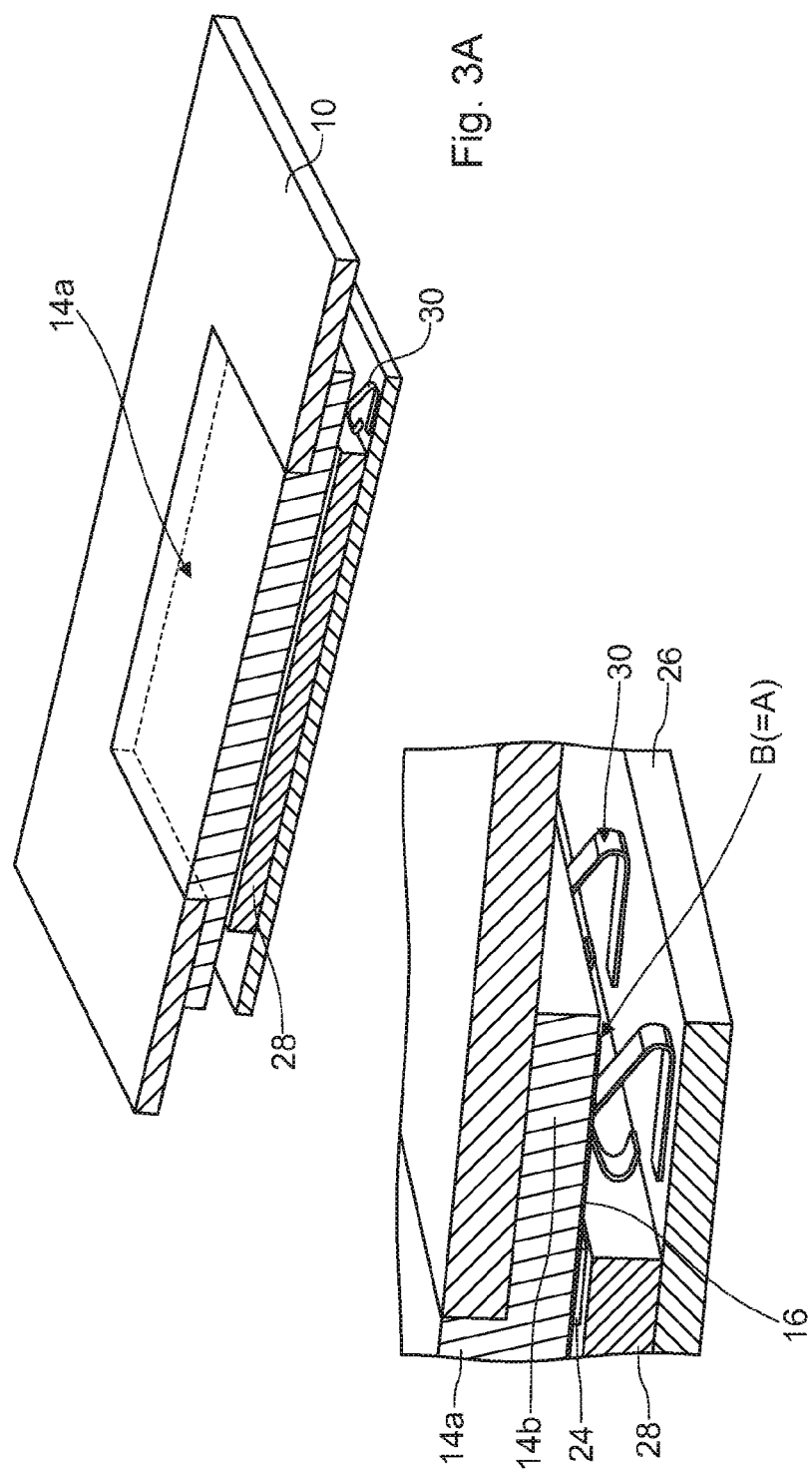
FIG. 3A and FIG. 3B show two perspective partial views in section of the input device in FIG. 2.
Figure 4:
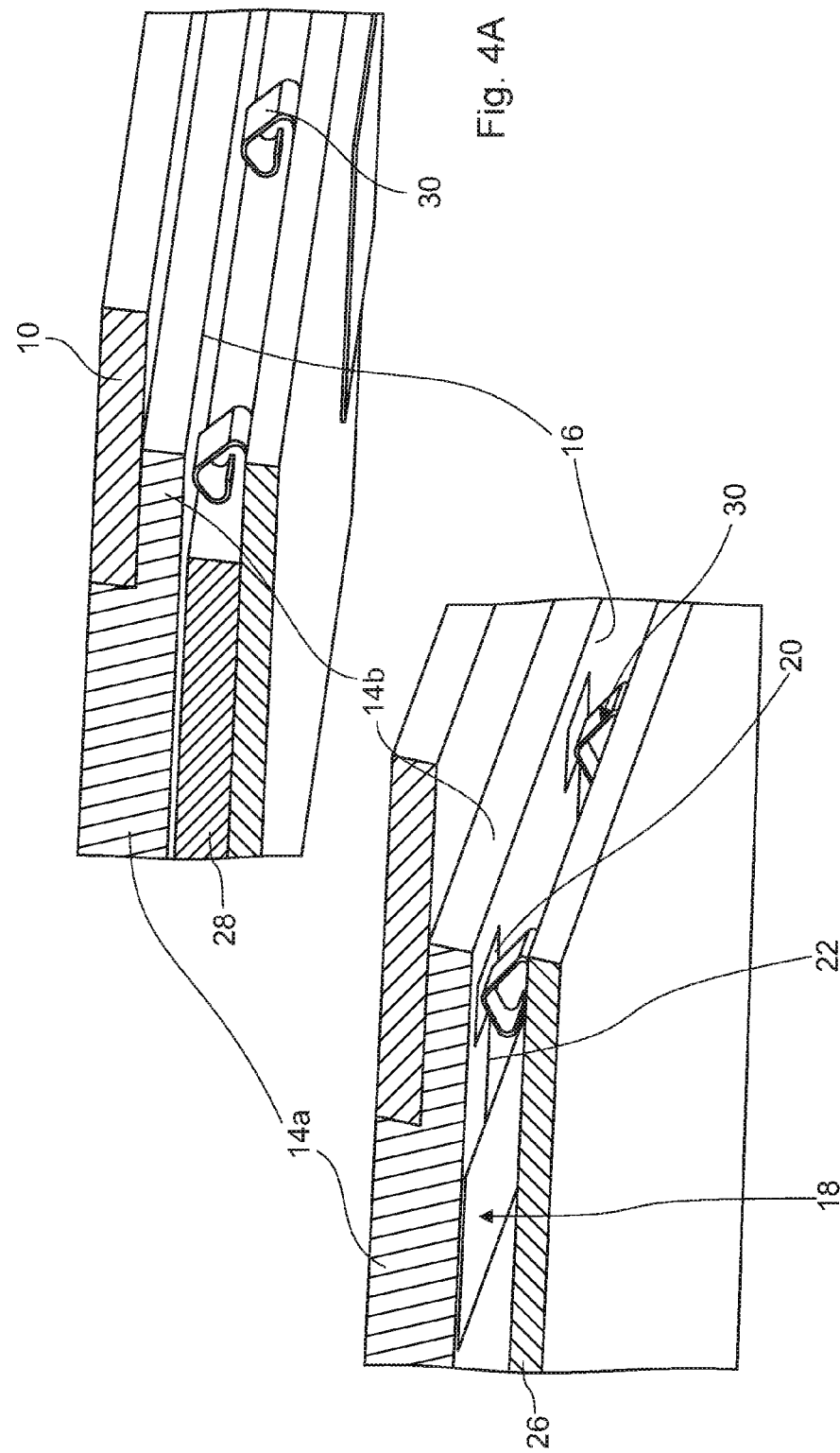
FIG. 4A and FIG. 4B show two further perspective partial views in section of the input device in FIG. 2.

As shown in FIGS. 2 to 4, the control section 14a of the cover plate 14 is surrounded circumferentially by a contacting section 14b which is connected to the control section 14a and is preferably designed to be integral with the latter. The layer thickness of the contacting section 14b is smaller than the layer thickness of the control section 14a of the cover plate 14.

That side of the control section 14a of the cover plate 14 which faces away from the user of the input device forms or defines a sensor plane A. That side of the contacting section 14b which faces away from the user of the input device forms or defines a contacting plane B. In this exemplary embodiment with the essentially flat control panel 10, the control section 14a and the contacting section 14b of the cover plate 14 are also designed to be essentially flat. Moreover, in this exemplary embodiment the sensor plane A of the control section 14a and the contacting plane B of the contacting section 14b are arranged in the same plane as each other (A=B, see, FIGS. 3 and 4). In the case of differently selected layer thicknesses, the sensor plane A and the contacting plane B are also arranged parallel to each other.

The cover plate 14 is preferably designed as a single piece and forms a rigid, i.e. dimensionally stable component. It can be produced, for example, as an injection-molded part.

The cover plate 14 is, for example, adhesively bonded to the control panel 10 and any gap between the control section 14a and the edge of the recess 12 is preferably sealed or adhesively bonded.

The cover plate 14 described serves as a stable carrier for a sensor film 16. The sensor film 16 is designed as a flexible component and is firmly connected to that side of the cover plate 14 which faces away from the user, for example is adhesively bonded by means of a transparent adhesive or is laminated to the cover plate 14.

The sensor film 16 in essence consists of a transparent plastic film (for example PET or PC) as the carrier film. It is additionally printed with electrically conductive structures which in particular form capacitive sensor fields 18, electric contact fields 20, and electric connecting lines 22 between them. They are preferably provided on that side of the sensor film 16 which faces away from the cover plate 14. While the capacitive sensor fields 18 are positioned in the region of the control section 14a of the cover plate 14 parallel to the sensor plane A, the electric contact fields 20 are provided in the region of the contacting section 14b of the cover plate 14 parallel to the contacting plane B. As a rule, each sensor field 18 is connected electrically conductively to a contact field 20 via an electric connecting line 22. Depending on the application, one or more sensor fields 18 can be provided in order to provide one or more control elements for the user.

Each capacitive sensor field 18 forms, together with for example a finger of the user and via the cover plate 14 or its control section 14a as a dielectric, a capacitance which can vary according to the activation of the input device, i.e. touching or not touching, or moving a finger close or not to the control section 14a of the cover plate 14. The change in the value of the capacitance of the capacitive sensor field 18 can be captured at that contact field 20 of the sensor film 16 which is connected to this sensor field 18 and is processed and evaluated by a suitable electronic evaluation unit. The electronic evaluation unit is in turn connected to an appliance management unit or integrated into the latter.

The electronic evaluation unit is arranged, for example, on a carrier plate 26. In the case of the flat control panel 10, this carrier plate 26 is oriented essentially parallel to the control panel 10. Multiple electric contact fields are formed on that side of the carrier plate 26 which faces the control panel 10.

The electric contact fields 20 of the sensor film 16 (and hence also the capacitive sensor fields 18 of the sensor film 16) are connected electrically conductively to the electric contact fields of the carrier plate 26 via structurally identical C-shaped leaf spring elements 30 made from an electrically conductive material (for example, metal). In the assembled state of the input device (see, FIGS. 3 and 4), the electric contact elements 30 designed as leaf springs are pressed together slightly so that they form a good electrical contact with the electric contact fields of the sensor film 16 and of the carrier plate 26 via their spring force.

In an alternative embodiment, the electric contact element 30 is welded to the electric contact field of the carrier plate 26. In another alternative embodiment, the electric contact element 30 is attached integrally to the sensor film 16 or to its electric contact field 20, for example by being heat staked, injection molded, clipped on, pushed on, pressed in, or the like.

In particular if the electric contact elements 30 are welded to the electric contact fields of the carrier plate 26, they each have, at their side which faces the electric contact fields 20 of the sensor film 16, a contact section which is designed such that, in the assembled state of the input device, it penetrates at least partially into the respective electric contact field 20 of the sensor film 16. The position of the stamping burr is, for example, adapted accordingly or a cutting or scratching edge is formed on the contact section of the electric contact element 30. Alternatively or additionally, the electric contact field 20 of the sensor film 16 can also be roughened, for example by an erosion structure of the contact field 20 or by mechanical roughening.

With such a design of the electric contact element 30, owing to the spring force of the electrically conductive contact element 30, the latter penetrates at least partially into the electric contact field 20 of the sensor film in the assembled state of the input device and thus ensures an electrically conductive connection with the electrically conductive layers of the contact field by it cutting into or scratching the surface of the contact field 20 of the sensor film 16 in order to perforate the layers of the contact field 20 which may be poorly conductive.

As explained above and illustrated in FIGS. 2 to 4, the contacting section 14b of the cover plate 14 is positioned outside the recess 12 in the control panel 10 next to the control section 14a of the cover plate 14. In a corresponding fashion, the capacitive sensor fields 18 of the sensor film 16 are arranged in the region of the control section 14a of the cover plate 14, whilst the electric contact fields 20 of the sensor film 16 are arranged in the region of the contacting section 14b of the cover plate 14 next to the recess 12 in the control panel 10. The electric contact elements 20 for electrically conductively connecting the electric contact fields 20 of the sensor film 16 to the electric contact fields of the carrier plate 26 are accordingly likewise arranged outside the recess 12 in the control panel 10. The position information "outside" and "next to" here in each case refer to a direction within the spatial plane of the sensor plane A.

As a result of this special design of the input device, the functionalities of the sensor unit, on the one hand, and of the electric contacting, on the other hand, can be separated spatially. The sensor unit can consequently be adapted optimally to the respective control panel 10. In particular the capacitive sensor fields 18 of the sensor film 16 can extend essentially parallel to the outer side of the control panel for any spatial structures of the latter and hence enable a good and uniform signal output. It is simply necessary for the control section 14a of the cover plate 14 to be shaped accordingly in order to do this. Irrespective of this, the contacting plane B can be oriented essentially parallel to the carrier plate 26, which permits simple and reliable electrical contacting of the sensor fields 18 via the contact fields 20 of the sensor film 16 and with simple contact elements 30, as well.

As shown in FIGS. 2 to 4, a display device 28 in the form of, for example, an LED, LCD or TFT display is additionally arranged on the carrier plate 26 in the region of the control section 14a of the cover plate 14. A spacing and sealing element 24 made from an electrically non-conductive material is arranged between that upper side of the display device 28 which faces the cover plate 14 and the sensor film 16.

In order to be able to see the optical display and/or illumination which is provided by this display device 28, the sensor film 16 and at least the control section 14a of the cover plate 14 is designed to be at least partially transparent.

Although not shown, decorative elements, for example in order to identify the control fields of the input device which are formed by the capacitive sensor fields 18 of the sensor film 16 can optionally be provided. The decorative elements are, for example, formed by an at least partially transparent decorative film. Such a decorative film can be rigidly connected, for example adhesively bonded, to the display device 28, the sensor film 16 or the cover plate 14. Alternatively, the visual decorative elements can also be integrated into the sensor film 16.

A second exemplary embodiment of a touch- and/or proximity-sensitive input device, as can be used for example in a (large) household appliance such as for example a washing machine or a dishwasher, will now be described in detail with reference to FIGS. 5 and 6. Identical or corresponding components are here marked with the same reference numerals as in the first exemplary embodiment.

In this second exemplary embodiment, the separation of the functionalities of the sensor unit and the electrical contacting of the input device according to the invention is even clearer.

Figure 5:
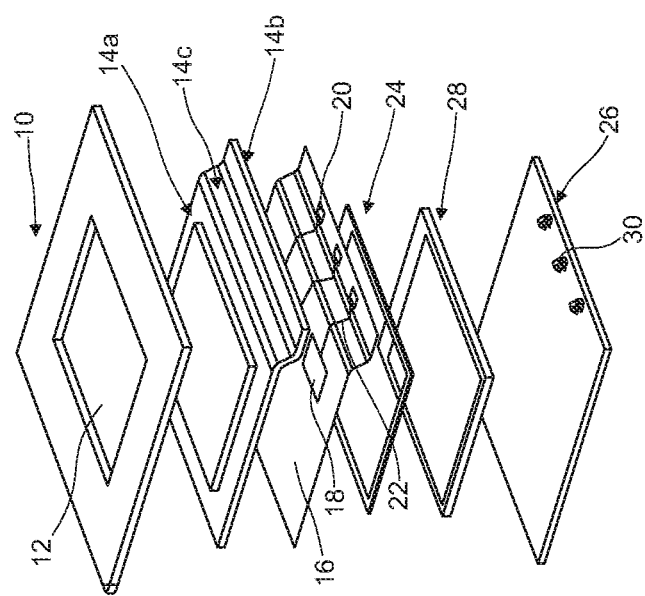
FIG. 5 shows a perspective exploded view of an input device according to a second exemplary embodiment of the inventing.
Figure 6:
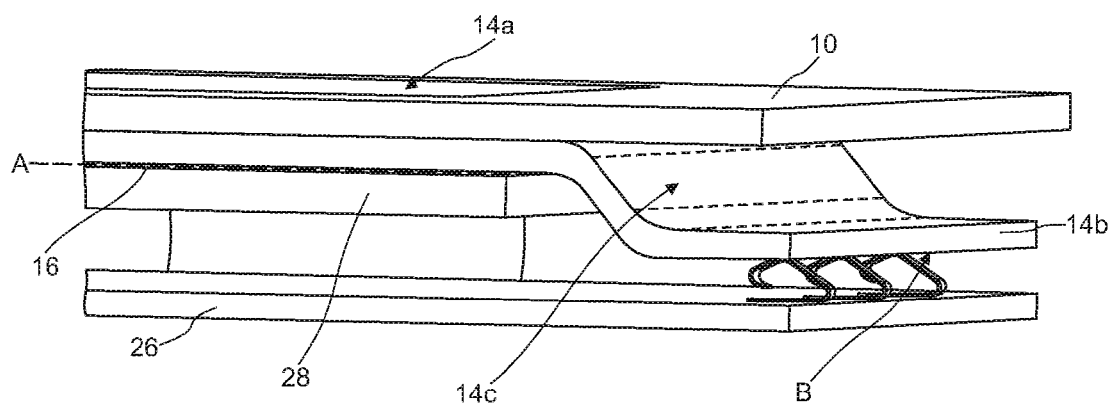
FIG. 6 shows a perspective partial view in section of the input device in FIG. 5.

The exemplary embodiment of the input device illustrated in FIGS. 5 and 6 differs from the first exemplary embodiment in FIGS. 1 to 4 in particular in the fact that the sensor plane A and the contacting plane B do not extend in the same plane as each other.

This is achieved in particular by a special design of the cover plate 14. The control section 14a of the cover plate 14, which forms the sensor plane A, and the contacting section 14b of the cover plate 14, which forms the contacting plane B, do not extend in the same plane but at different distances from the carrier plate 26 (see, FIG. 6) and/or in different orientations relative to the carrier plate 26. The control section 14a and the contacting section 14b of the cover plate 14 are here integrally connected to each other by a rigid connecting section 14c of the cover plate 14. The connecting section 14c here preferably extends between the two other sections 14a, 14b of the cover plate 14 in a shape which is curved, angled, twisted, contorted, or the like multiple times.

As a flexible component, the sensor film 16 adapts itself readily to the design of the cover plate 14.

The control panel 10 is designed to be essentially flat in this exemplary embodiment as well. The control section 14a of the cover plate 14 is accordingly also designed to be essentially flat. Particular advantages of this embodiment result, however, also in the case of three-dimensionally structured (for example, curved, domed, etc) control panels 10, in which case the control section 14a of the cover plate 14 is adapted to this structure. The contacting section 14b of the cover plate 14 is in this case also designed to be essentially flat and extends essentially parallel to the carrier plate 26.

The remaining components of the input device in FIGS. 5 and 6 correspond to those in the first exemplary embodiment.

The following is a summary list of reference numerals and the corresponding structure used in the above description of the invention:

10 control panel
12 recess
14 cover plate
14a control section
14b contacting section
14c connecting section
16 sensor film
18 capacitive sensor field
20 electric contact field
22 electric connecting line
24 spacer element
26 carrier plate
28 display device
30 electric contact element
A sensor plane
B contacting plane

The invention claimed is:

1. A touch- and/or proximity-sensitive input device, comprising:
   a cover plate having a control section, said control section having a side facing a user of the input device and forming a control field for the user, and having a side facing away from the user and forming a sensor plane;
   a sensor film disposed on the side of said cover plate facing away from the user, said sensor film having at least one flat, planar capacitive sensor field within a region of said control section and extending in a first plane substantially parallel to said control section of said cover plate;
   a carrier plate disposed on a side of said sensor film facing away from the user, and at least one electric contact field on said carrier plate;
   said cover plate having a contacting section disposed, in a direction of said sensor plane, next to said control section, said contacting section having a side facing away from the user and forming a contacting plane;
   said sensor film having at least one electric contact field disposed, in a direction of said sensor plane, next to said at least one sensor field and connected electrically conductively to said at least one sensor field, said at least one electric contact field extending in a second plane at a different level from said first plane; and
   at least one electric contact element disposed between said carrier plate and said sensor film for connecting said at least one sensor field of said sensor film electrically conductively to said at least one electric contact field on said carrier plate, said at least one electric contact element connecting said at least one electric contact field of said sensor film electrically conductively to said at least one electric contact field on said carrier plate.

2. The input device according to claim 1, wherein the input device is configured for an electronic household appliance.

3. The input device according to claim 1, wherein the sensor plane formed by said control section of said cover plate extends substantially parallel to said control field.

4. The input device according to claim 1, wherein the contacting plane formed by said contacting section of said cover plate extends substantially parallel to said carrier plate.

5. The input device according to claim 1, wherein said cover plate has a connecting section connecting said contacting section substantially rigidly to said control section.

6. The input device according to claim 5, wherein said connecting section of said cover plate has a curved shape so that the sensor plane formed by said control section of said cover plate, and the contacting plane formed by said contacting section of said cover plate extend at least partially at different distances and/or orientations with respect to said carrier plate.

7. The input device according to claim 1, wherein said sensor film is firmly connected to the side of said cover plate facing away from the user.

8. The input device according to claim 1, wherein said at least one electric contact element is elastic in a direction transverse to the contacting plane.

9. The input device according to claim 1, wherein said at least one electric contact element is firmly connected to said at least one electric contact field of said sensor film or to said at least one electric contact field of said carrier plate.

10. The input device according to claim 1, wherein said at least one electric contact element has, on a side thereof facing said at least one electric contact field of said sensor film, a contact section configured to penetrate at least partially into said at least one electric contact field of said sensor film.

11. The input device according to claim 1, which comprises at least one display device disposed on said carrier plate; and wherein said cover plate and said sensor film are at least partially transparent.

12. An electronic household appliance, comprising at least one touch- and/or proximity-sensitive input device according to claim 1.

13. The electronic household appliance according to claim 11, wherein the control section of the cover plate of the input device is disposed behind an at least partially transparent control panel or in a recess of a control panel.

14. A touch- and/or proximity-sensitive input device, comprising:
   a cover plate having a control section, said control section having a side facing a user of the input device and forming a control field for the user, and having a side facing away from the user and forming a sensor plane;
   said cover plate having a contacting section disposed, in a direction of said sensor plane, next to said control section, said contacting section having a side facing away from the user and forming a contacting plane;
   a sensor film disposed on the side of said cover plate facing away from the user, said sensor film having a first region extending in a first plane substantially parallel to and below said control section of said cover plate, a second region extending in a second plane at a different level from said first plane and below said contacting section, and having a connecting section connecting said first region with said second region;
   said sensor film having at least one capacitive sensor field within said first region below said control section and at least one electric contact field within said second region below said contacting section and connected electrically conductively to said at least one sensor field;
   a carrier plate disposed on a side of said sensor film facing away from the user, and at least one electric contact field on said carrier plate; and
   at least one electric contact element disposed between said carrier plate and said sensor film for connecting said at least one sensor field of said sensor film electrically conductively to said at least one electric contact field on said carrier plate, said at least one electric contact element connecting said at least one electric contact field of said sensor film electrically conductively to said at least one electric contact field on said carrier plate.

\* \* \* \* \*